United States Patent
Yeung et al.

(10) Patent No.: US 7,245,156 B2
(45) Date of Patent: Jul. 17, 2007

(54) PRE-DRIVERS FOR CURRENT-MODE I/O DRIVERS

(75) Inventors: Evelina F. Yeung, San Jose, CA (US); Karthisha Canagasaby, Santa Clara, CA (US); Sanjay Dabral, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 183 days.

(21) Appl. No.: 11/094,810

(22) Filed: Mar. 31, 2005

(65) Prior Publication Data

US 2006/0220674 A1    Oct. 5, 2006

(51) Int. Cl.
*H03K 19/0175* (2006.01)
(52) U.S. Cl. .......................................... 326/86; 326/83
(58) Field of Classification Search ................ 326/83, 326/86–87, 68, 29; 327/108, 170
See application file for complete search history.

(56) References Cited

U.S. PATENT DOCUMENTS 6,507,225 B2 *   1/2003   Martin et al. ............... 327/108
6,819,145 B2 *  11/2004   Swartz et al. ................ 327/65

OTHER PUBLICATIONS

Maheshwari et al., Differential Current-Sensing for On-Chip Interconnects, IEEE Transactions on Very Large Scale Integration (VLSI) Systems, vol. 12, No. 12, Dec. 2004, pp. 1321-1329.
Hamzaoglu et al., Split-Path Skewed (SPS) CMOS Buffer for High Performance and Low Power Applications, IEEE Transactions on Circuits and Systems-II: Analog and Digital Processing, vol. 48, No. 10, Oct. 2001.

* cited by examiner

*Primary Examiner*—James H. Cho
(74) *Attorney, Agent, or Firm*—Ked & Associates, LLP

(57) ABSTRACT

A pre-driver circuit includes a first stage to generate a first pre-driver signal and a second stage to generate a second pre-driver signal. The first and second stages are to generate the first and second pre-driver signals to cross at a point which reduces rise-and-fall mismatch in differential signal outputs from a current-mode driver.

35 Claims, 12 Drawing Sheets

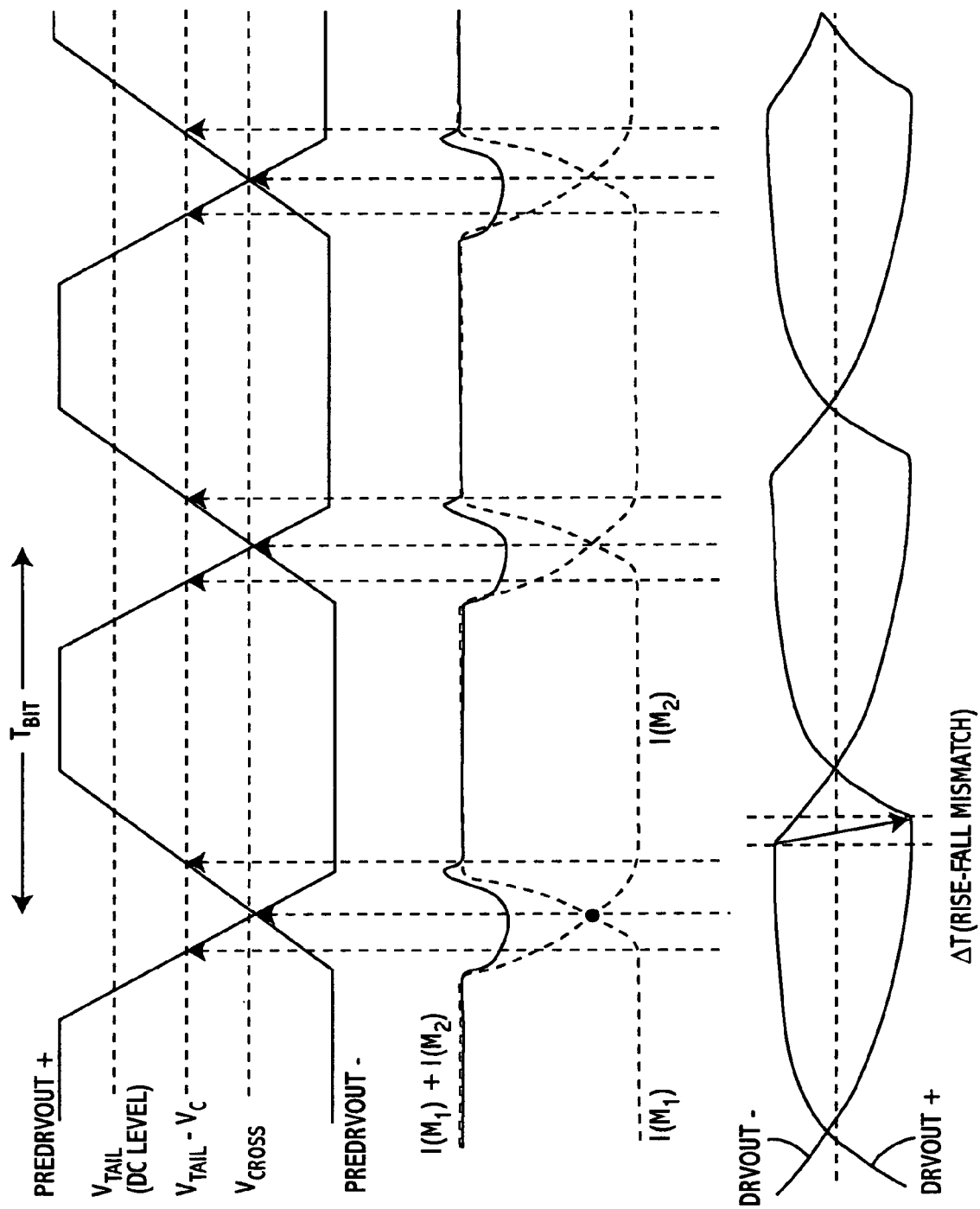

PRE-DRIVERS FOR CURRENT-MODE I/O DRIVERS

FIELD

One or more embodiments of the present invention relate to semiconductor devices, and more particularly to circuits for charging transmission lines that carry electrical signals.

BACKGROUND

The high-speed (e.g., gigabit) transmitters in a high-speed input/output (I/O) interface typically use one of two types drivers to charge their differential signal lines: current-mode drivers and voltage-mode drivers. Despite higher power consumption, current-mode drivers may be used because they offer supply noise immunity and better linearity when pre-emphasis equalization is incorporated into the line. These drivers, however, are not without drawbacks. For example, mismatch in the rise and fall transitions of the driver output signals develop, which causes reduced receiver eye timing and voltage margins as well as performance bottleneck.

BRIEF DESCRIPTION OF THE DRAWINGS

FIGS. 3(a)-3(c) are graphs showing signals generated by a current-mode driver that uses skewed pre-driver inverters, with FIG. 3(a) showing pre-driver output signals, FIG. 3(b) showing driver output signals, and FIG. 3(c) showing mismatch that occurs in the driver output signals.

DETAILED DESCRIPTION

Figure 1A:
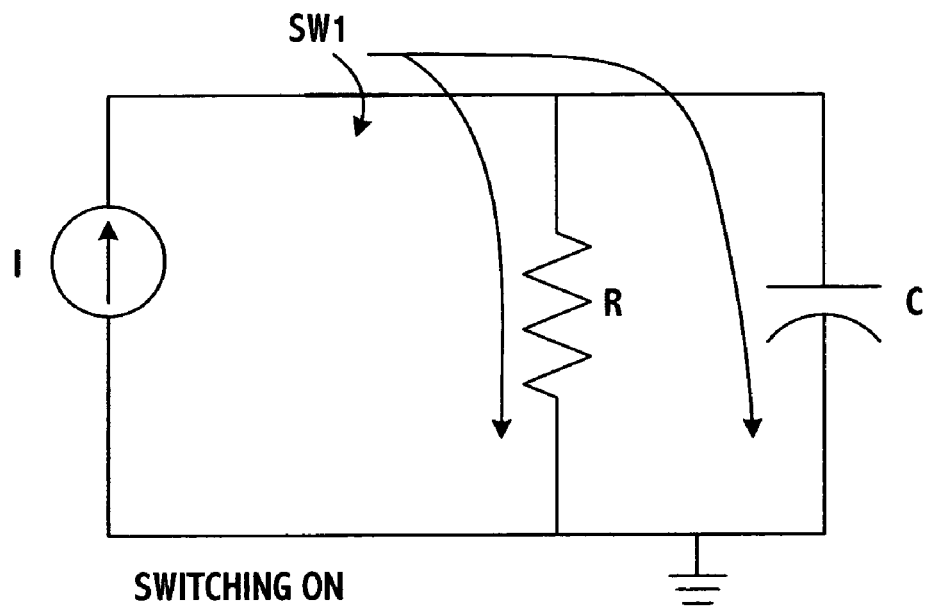
FIGS. 1(a) and 1(b) are diagrams showing an ideal model of a current-mode driver, with FIG. 1(a) showing line-charging operation and FIG. 1(b) showing a line-discharging operation.
Figure 1B:
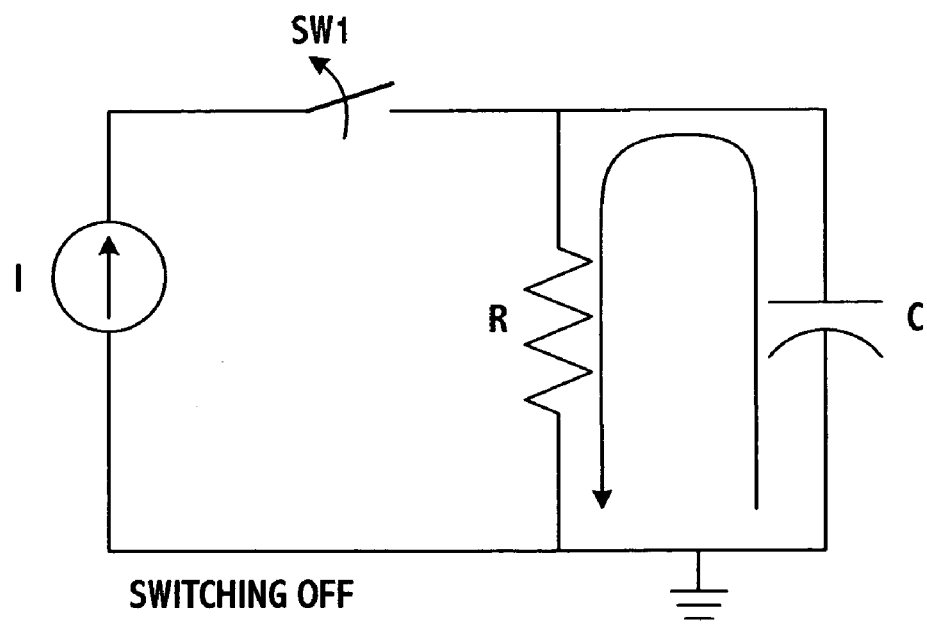

FIGS. 1(a) and 1(b) show conceptually the operation of a current-mode driver under ideal conditions. To charge a transmission line, a switch SW1 is closed to allow current from source I to flow into the RC circuit, thereby charging the capacitor and thus the line voltage to a predetermined level. See FIG. 1(a). To discharge the line, the switch is opened and the charge in the capacitor discharges though the resistor. See FIG. 1 (b). The output switching-on and switching-off transitions have a time constant equal to the product of R and C. In practice, however, many proposed systems exhibit a mismatch between the switching-on and switching-off transitions that degrades performance.

Figure 2:
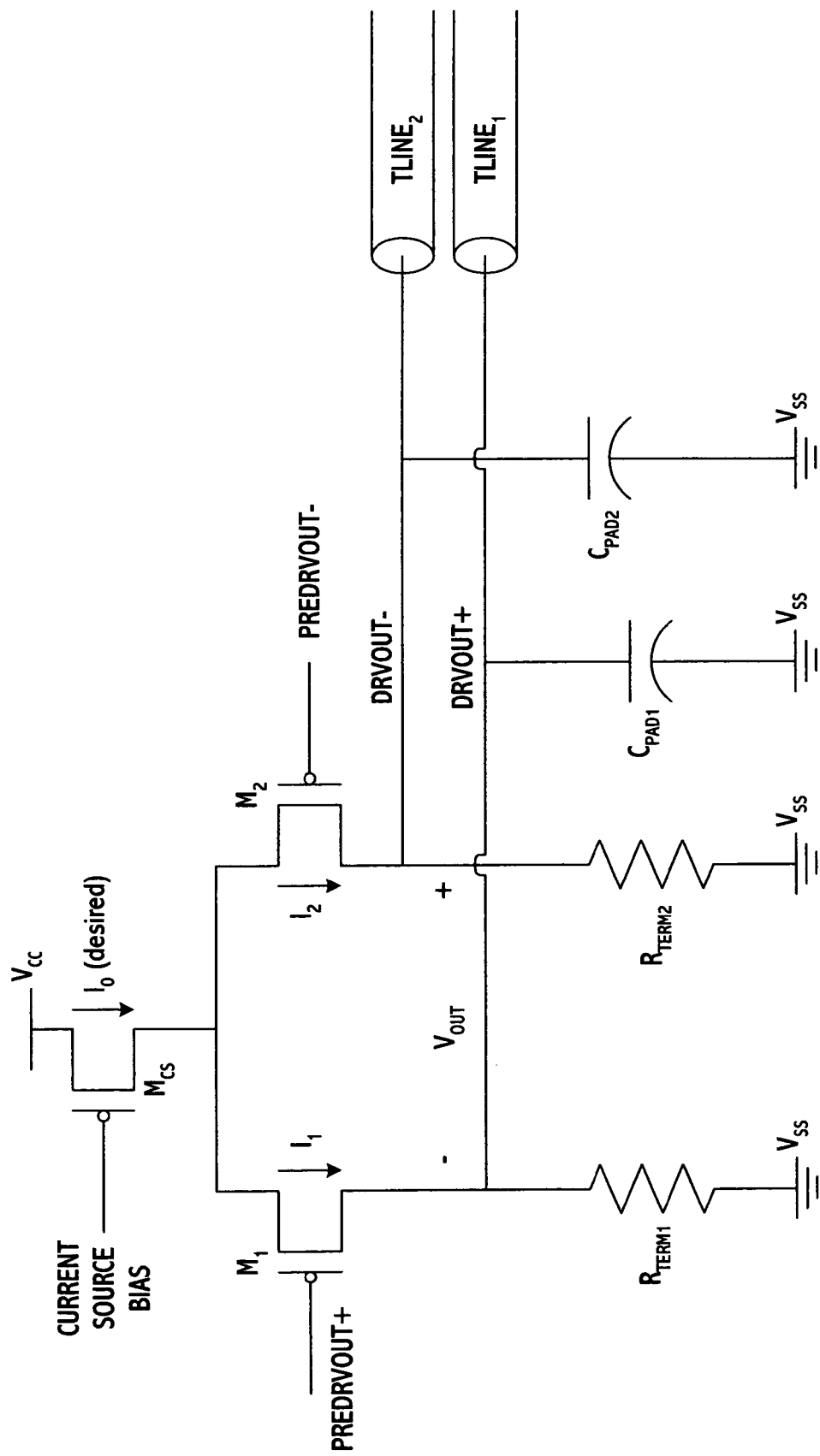
FIG. 2 is a diagram showing an output driver implemented using a differential pair of p-type metal oxide semiconductor (PMOS) transistors with a simple PMOS current source.

FIG. 2 shows a current-mode driver for charging a differential pair of signal lines under practical conditions. The driver includes a current source and a pair of transistors $M_1$ and $M_2$. The current source is formed from a transistor $M_{CS}$ biased to a voltage with respect to supply voltage $V_{CC}$, and transistors $M_1$ and $M_2$ are coupled to RC circuits $R_{term1}$, $C_{pad1}$ and $R_{term2}$, $C_{pad2}$ respectively. In operation, a current signal $I_0$ is generated when the gate of transistor $M_{CS}$ receives a bias signal. The current is switched through transistors $M_1$ and $M_2$ based on the logical values of pre-driver output signals predrvout+ and predrvout−. Transistors $M_1$ and $M_2$ act as switches which steer current from the current source to one side or the other based on the timing and the logical values of the pre-driver output signals. The current passing through transistor $M_1$ is labeled $I_1$ and the current passing through transistor $M_2$ is labeled $I_2$.

The pre-driver signals may be complementary to help ensure that $I_1+I_2=I_0$ at any given time, e.g., when one driver transistor is switched on, the other is switched off simultaneously and vice versa. Thus, when predrvout+ transitions to a low value, current is switched through $M_1$ to generate a driver output signal drvout−, which charges capacitor $C_{pad1}$ and proportionally line $T_{Line1}$ to a predetermined level equal or substantially equal to $I_0*(R_{term1}//Z)$ where Z=characteristic impedance of $T_{Line1}$. During this time, predrvout− is high and the voltage stored in $C_{pad2}$, and thus the line voltage of $T_{Line2}$, discharges.

Conversely, when predrvout+ transitions to a high value, the voltage stored in $C_{pad1}$, and thus the line voltage of $T_{Line1}$, discharges. During this time, predrvout− is low and current is switched through $M_2$ to generate a driver output signal drvout+, which charges capacitor $C_{pad2}$ and proportionally line $T_{Line2}$ to a predetermined level equal or substantially equal to $I_0*(R_{term2}//Z)$, where Z=characteristic impedance of the $T_{Line2}$. The complementary signals that switch the driver transistors balance the rise and fall transitions of the driver output signals (drvout+, drvout−) and therefore are considered suitable for many applications.

The circuit in FIG. 2 is implemented in PMOS where the output signals are referenced to a supply voltage ($V_{ss}$), which in this case is ground. In an equivalent n-type metal oxide semiconductor (NMOS) implementation, the output signals may be referenced to supply voltage $V_{CC}$. To minimize parasitic capacitive self-loading introduced in the driver output nodes, and therefore to reduce the rise-and-fall time constant, transistors $M_1$ and $M_2$ may be made as small as possible and yet large enough to switch all the current from one side to another.

Hence, it is desirable to maximize the gate overdrive of the switching (or steering) transistors when they are on. This may be accomplished by adjusting the pre-driver "low" output level completely down to the supply voltage ($V_{ss}$) potential. For this reason, a full complementary metal oxide semiconductor (CMOS)-swing pre-driver implementation may be used over implementations that use swings lower than full CMOS level. (CMOS swing may be understood to mean rail-to-rail swing, e.g., $V_{CC}$ to $V_{SS}$).

In advanced CMOS technologies, the threshold voltages ($V_t$) of transistors have not scaled down as fast as supply voltage ($V_{CC}$), resulting in larger and larger $V_t/V_{CC}$ ratios. Consequently, transistors, both PMOS and NMOS, demonstrate $V_t/V_{CC}$ ratios typically in the range of 1:3. Other drawbacks of CMOS drivers also exist. For example, increases in the data-rate of the link worsen frequency-dependent channel attenuation. To overcome the resulting channel loss, larger transmitter swings need to be used but at the expense of larger current drawn or higher power dissipation.

The simplest CMOS pre-driver is an inverter. A drawback of CMOS pre-drivers relates to mismatch that occurs in the rise and fall transitions of the driver output signals. This effect is pronounced when inverters are used as pre-drivers to generate the pre-driver output signals, and may be attributed to two factors. (These factors are explained with reference to the PMOS driver implementation of FIG. 2.)

The first factor relates to the DC level corresponding to the point in time when the pre-driver output signals cross one another. The inventors have determined that this time point is critical, because it effectively controls whether the sum of the currents drawn by the two driver devices ($I_1+I_2$) is equal to $I_0$. In other words, it determines whether clean steering of current from one PMOS device in the differential pair to another occurs as intended. If clear steering does not occur, a mismatch will form in the rise and fall transitions of the driver output signals, thereby degrading signal quality.

For example, if the pre-driver output crossing point is not skewed, and the pre-driver output transitions cross at $V_{CC}/2$, the sum of the currents drawn from the pre-driver circuits is much lower than the source current $I_0$ (i.e., $I_1+I_2<I_0$), causing excessive movements in the tail-node voltage $V_{tail}$ which lead to at least the following problems: (1) breakdown in the ideal current-mode modeling of the driver as shown in FIG. 1, (2) current fluctuations due to channel modulation of the current source transistor $M_{CS}$, which, in turn, results in an inability to cleanly steer current from one pre-driver transistor to the other, and (3) movements in the tail-node voltage also couple differently to the driver outputs, leading to differential noise.

The second factor relates to slew rate of the pre-driver output signals input into the driver transistors. The currents supported by these transistors are not linearly proportional to their gate overdrive. Thus, even if the pre-driver output transitions have equal rise and fall slew rates, the driver transistor being switched on can support a faster increase in current than the driver transistor being switched off can reduce its current. The result, again, is that the sum of the driver output currents is not equal to the current $I_0$ (e.g., $I_1+I_2<I_0$), which leads to breakdown of the ideal current-mode modeling.

The foregoing drawbacks lead to a mismatch in the rise and fall transitions in the driver output signals (drvout+, drvout−). In effort to improve performance, the first factor can be mitigated by skewing the threshold of the inverter (pre-driver) in a way that lowers the crossing point of the pre-driver output signals. Skewing the inverter threshold will not improve matching of the rise and fall transitions in the driver output signals. This is because in order to skew the switching point of the inverter lower, the driver strength of the NMOS has to be stronger than the PMOS, resulting in a faster falling transition than the rising transition. This means that the driver being turned on will turn on faster, in addition to having a faster increase in current, while the driver being turned off switches off slower, in addition to having a slower decrease in current. As a result, the driver output signal exhibits an even slower falling transition compared with the rising transition of the driver being turned on, making the mismatch worse. This is exemplified in FIG. 3(c) discussed in greater detail below.

The slow-falling transition time of the driver being turned off, and the discrepancy of this timing with the relative faster transition time of the driver being turned on as also shown in FIG. 3(c), reduces timing and voltage margins in the eye diagram taken at the receiver end of the differential transmission line. The mismatch cannot be improved by reducing the output capacitive load.

FIGS. 3(a)-3(c) show signals generated by a current-mode driver of FIG. 2 that uses skewed pre-driver inverters implemented in CMOS. In FIG. 3(a), the following DC levels are shown: tail-node voltage $V_{tail}$, the difference between the tail-node voltage and the driver-transistor threshold voltage ($V_{tail}$−$V_t$), and the point in time when the pre-driver output signals cross, $V_{cross}$. The value of ($V_{tail}$−$V_t$) corresponds to the point in time when one of the driver transistors switch off completely, and hence the other driver transistor sinks $I_0$. The pre-driver output signals (predrvout+, predrvout−) are shown over each of a plurality of bit periods, $T_{bit}$.

FIG. 3(b) shows that the crossing point X of the driver current signals I(M1) and I(M2) corresponds to $V_{cross}$, i.e., the point in time when the pre-driver output signals cross in FIG. 3(a). At this point, the falling transitions of currents I(M1) and I(M2) start earlier than the rising transitions of these currents.

FIG. 3(c) shows that the foregoing effects produce a mismatch (Δt) between the rise and fall transitions of the driver output signals. That is, the driver output signals have faster rise transitions than fall transitions (the curves for drvout− and drvout+ have fast rising slopes and gradual falling slopes), thereby causing the driver output signal to have an asymmetrical waveform. This mismatch (shown by the arrow) reduces timing and voltage margins in the receiver eye diagram along with the other performance degradations previously mentioned.

In accordance with one embodiment of the present invention, a method is provided for controlling the pre-driver output signals in a way that yields driver output waveforms that help optimize performance for a given application. To achieve this performance, the crossing point of the pre-driver signals may be set to a level which helps to ensure that at $V_{cross}$, $I_1=I_2$, or at least substantially so. The pre-driver outputs (i.e. driver inputs) are also engineered such that their pull-up time (e.g., switching-off of driver transistors) initiates later but has a faster slope than their pull-down time (e.g., switching-on of driver transistors). This will cause the mismatch in rise and fall transitions of the driver output signals to be reduced or eliminated.

Figure 4A:
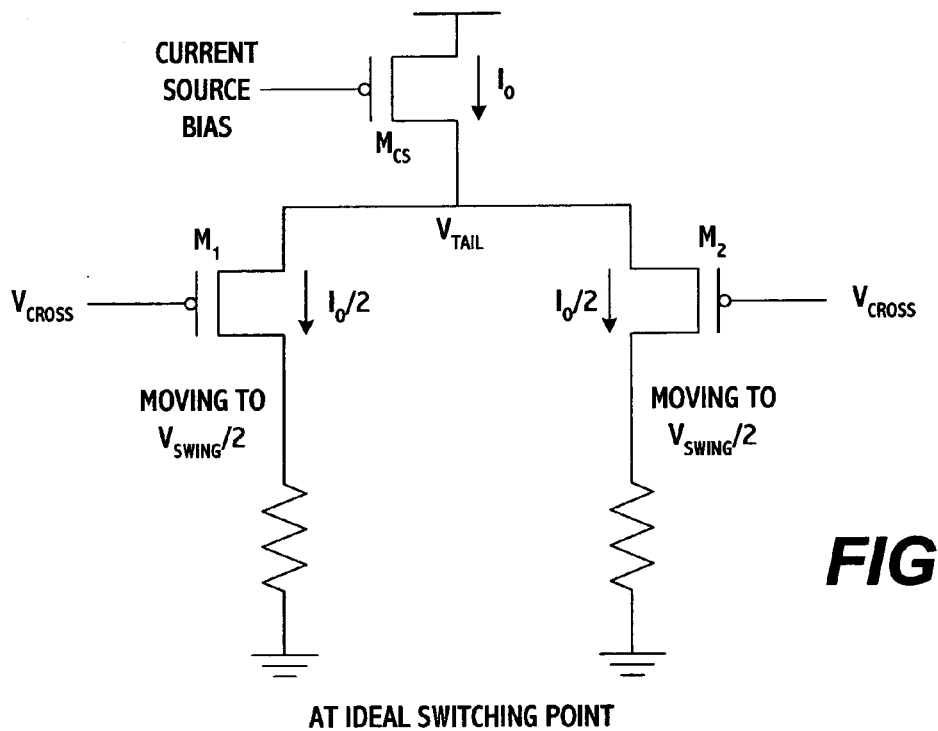
FIG. 4(a) is a diagram showing how the crossing point between pre-driver output signals may be set in accordance with one embodiment of the present invention.

FIG. 4(a) shows one way in which this crossing point may be attained. In order to suppress mismatch, the pre-driver output signals are pre-distorted to produce balanced driver outputs. This pre-distortion may be generated by setting the crossing point of pre-driver output signals predrvout+ and predrvout− so that current signals $I_1$ and $I_2$ at this time are equal to one another, or at least substantially so. Put differently, so that $I_1+I_2=(I_0/2)+(I_0/2)=I_0$, or so that $I_1+I_2$ equals $I_0$ to within a predetermined margin, at $V_{cross}$. When such a relationship exists, movement in the tail-node voltage $V_{tail}$ is minimized (or reduced), which in turn maximizes (improves) the timing and voltage margins in the driver output signals. (In FIG. 4(a), $V_{cross}$ is shown as an input into the gates of the driver transistors to symbolize that $I_1$ and $I_2$ are both equal $I_0/2$ when the pre-driver output signals cross at $V_{cross}$, and that this condition produces balanced driver outputs).

Figure 4B:
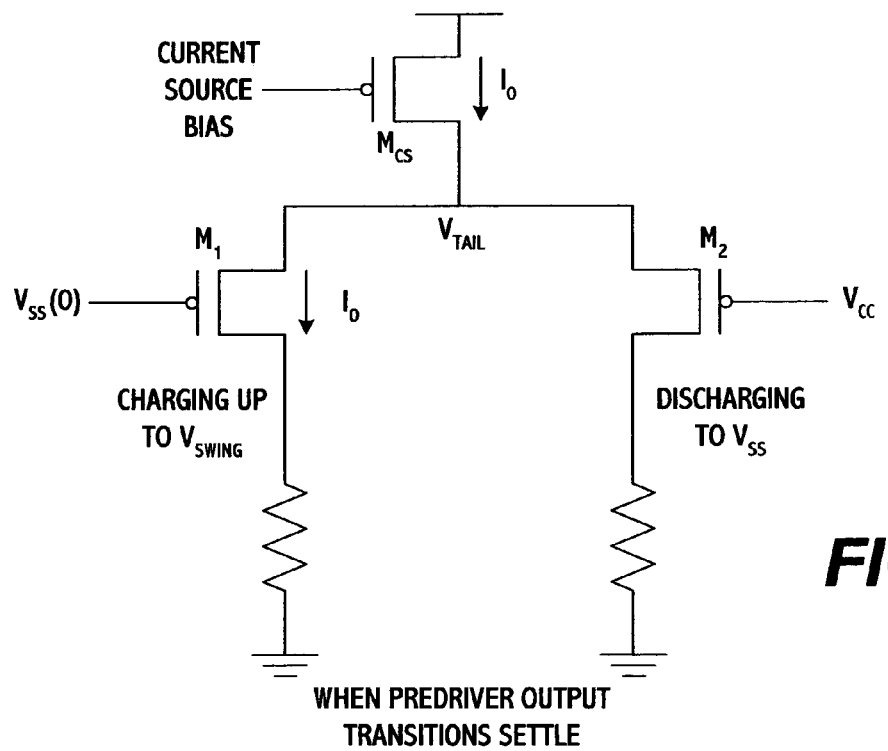
FIG. 4(b) is a diagram showing values obtained in the circuit of FIG. 4(a) when transitions in the pre-driver output signals have settled.

FIG. 4(b) shows the results of this pre-distortion in the post-transition period. Specifically, when the transitions in the pre-driver output waveforms settle, all the current $I_0$ from the current source is steered to the side where the predriver output is low (when the driver transistors are PMOS devices). At this point, gate signal of the driver transistor that is switched on (e.g., M1) equals reference voltage $V_{ss}$ (0), and the gate signal of the driver transistor that is switched off (e.g., M2) equals the supply voltage $V_{cc}$. As a result, the differential line coupled to M1 charges up to a predetermined voltage (e.g., $V_{swing}=I_0*R_{term}//Z_0$) and the differential line coupled to M2 discharges to the reference voltage ($V_{ss}$) in order to permit data transmission to occur.

Assuming that the transistors in the pre-drivers are in saturation at all relevant bias points, the following equations may be obtained:

$$I_0/2 = K(V_{tail} - V_{cross} - V_t)^\alpha \quad (1)$$

$$I_0 = K(V_{tail} - 0 - V_t)^\alpha \quad (2)$$

where $V_{swing}$ is the driver output swing, $V_{cross}$ is the voltage at which the pre-driver output signal transitions cross each other, $V_{tail}$ is the voltage at the tail node, and α is an exponent derived from a current-voltage (I-V) graph corresponding to the driver circuit. Given these equations, an intended crossing point $V_{cross}$ may be calculated for any application to help achieve optimal switching efficiency and performance.

Determining the crossing point and optimal slew rates for the pre-driver outputs that balance the rise and fall transitions in driver output signals may be based on the non-linearity of the I-V characteristics of the driver.

Figure 5A:
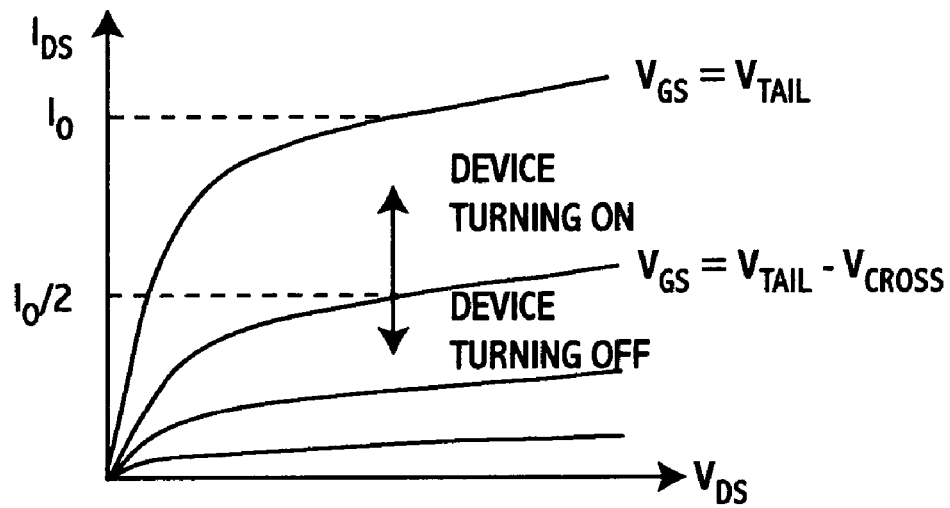
FIGS. 5(a) and 5(b) are diagrams showing examples of current-voltage (I-V) curves which may be used in accordance with one embodiment of the present invention for setting a crossing point that suppresses rise-and-fall transition mismatch in a current-mode driver circuit.

FIG. 5(a) is a graph showing an example of I-V curves for driver transistors M1 and M2. In this graph, drain-to-source current $I_{ds}$ is plotted against drain-to-source voltage $V_{ds}$, and curves are shown for when the gate-to-source voltage ($V_{gs}$) is equal to the tail-node voltage $V_{tail}$ and for when $V_{gs}$ is equal to the difference between the tail-node voltage and the voltage corresponding to the crossing point between the pre-driver output signals ($V_{tail}-V_{cross}$). The point where curve $V_{gs}=V_{tail}-V_{cross}$ intersects with current level $I_0/2$ defines when the driver transistors begin switching on or off.

As shown in FIG. 5(a), the turning-off action of each driver transistor has a slower gradient than the turning-on action. In order to reduce mismatch in the driver output signals, the pre-driver output signals are distorted, either to increase the rate of the pull-up transition (turning-off) of the driver transistors or decrease the rate of the pull-down transition (turning-on) of the driver transistors, or both. The pull-up and pull-down transitions may be adjusted in this manner.

Figure 5B:
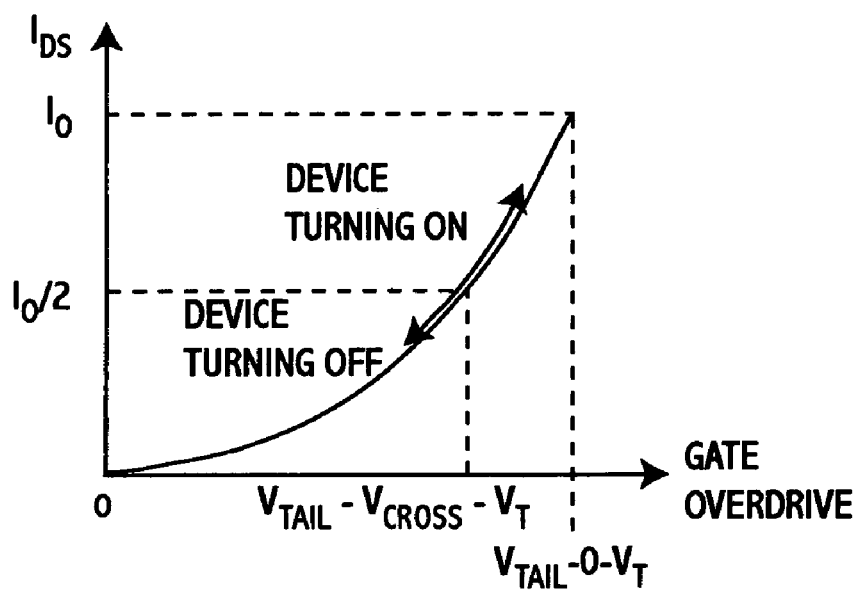

FIG. 5(b) is a graph showing the same current values ($I_0$, $I_0/2$) plotted against gate overdrive for transistors M1 and M2. The point on the curve where gate overdrive voltage equal to ($V_{tail}-V_{cross}-V_t$) intersects $I_0/2$ defines when the driver transistors begin turning on and off. This point may be related to on/off point in FIG. 5(a) for purposes of defining the crossing point of the pre-driver signals that reduces or eliminates mismatch in the driver outputs.

A ratio of the rise and fall transitions of the pre-driver output signals that may be used to balance (reduce or eliminate mismatch in) the driver outputs may be estimated in accordance with the following reciprocal relation:

$$T_{rise}(\text{turning off}):T_{fall}(\text{turning on}) = ((V_{tail} - 0 - V_t) - (V_{tail} - V_{cross} - V_t)) : (V_{tail} - V_{cross} - V_t) \quad (3)$$
$$= V_{cross} : (V_{tail} - V_{cross} - V_t)$$

Pre-distorting the pre-charge output signals to achieve the ratio in Equation (3) for given $V_{tail}$, $V_{cross}$, and $V_t$ values will ideally eliminate mismatch in the driver output signals.

Figures 6A, 6B, 6C:
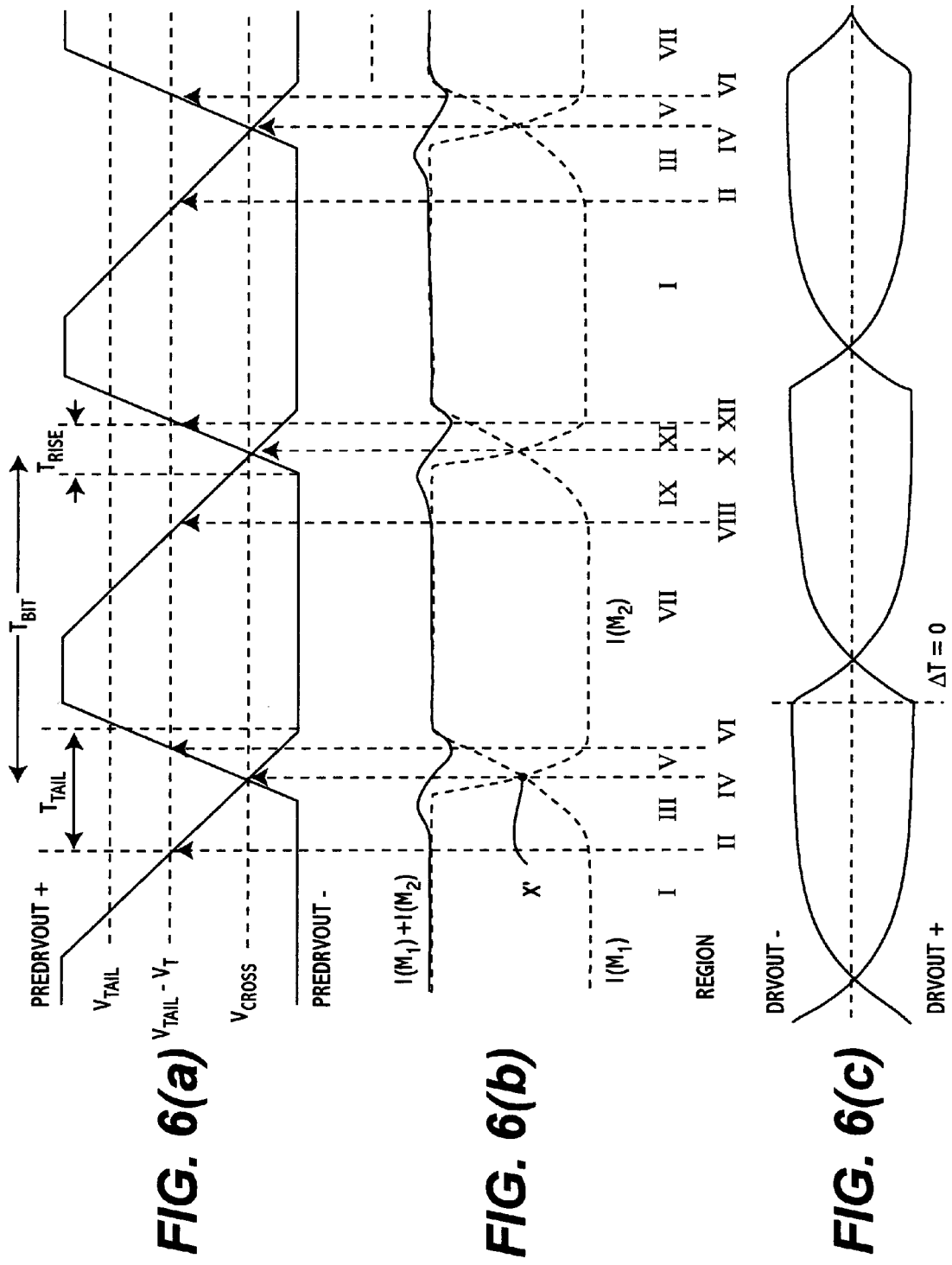
FIGS. 6(a)-6(c) are graphs showing waveforms that may be used in accordance with one embodiment of the present invention for suppressing rise-and-fall transition mismatch in a current-mode driver circuit using PMOS transistors, with FIG. 6(a) showing the crossing point of pre-driver output signals which has been shifted for mismatch suppression, FIG. 6(b) showing driver output current signals generated based on the crossing point in FIG. 6(a), and FIG. 6(c) showing the mismatch suppression that occurs in the driver output signals.

FIGS. 6(a)-6(c) show waveforms generated by application of the foregoing embodiment of the present invention. In FIG. 6(a), the pre-driver outputs signals have been pre-distorted to generate a crossing point ($V_{cross}$) which helps ensure that the currents $I_1+I_2=I_0$, or at least substantially so, and the rising input transition of driver transistors M1 and M2 starts later and yet is shorter than their falling transition.

FIG. 6(b) shows that this crossing point sets a corresponding position of X', which corresponds to the point where driver current signals I(M1) and I(M2) cross one another. At this point, $I_1+I_2=(I_0/2)+(I_0/2)=I_0$, or so that $I_1+I_2$ at least equals $I_0$ to within a predetermined margin, at the crossing point ($V_{cross}$). (Here, it may be assumed that $I_1$ and $I_2$ are synonymous with I(M1) and I(M2)).

FIG. 6(c) shows the beneficial effects of the shift performed in FIGS. 6(a) and 6(b). By shifting the crossing point ($V_{cross}$) of the pre-driver output signals to the intended position as described above, and so that $I_1=I_2=I_0/2$ at this point, and delaying the pre-driver output rising transition to start later and yet have a steeper slope than the falling transition, mismatch in the rise and fall transitions in the driver output signals is reduced or eliminated. Put differently, by comparing FIG. 6(c) to FIG. 3(c), it is clear that the pre-distortion shift causes Δt=0 or at least a smaller value, so that the driver output curves drvout− and drvout+ rise and fall with the same, or substantially the same, slope.

Suppressing mismatch in this manner causes the driver output to have a comparatively more symmetrical waveform (symmetry is proportional to the extent to which Δt is reduced), which improves timing and voltage margins in the eye diagram at the receiving end of the link, and performance bottlenecks are reduced.

A current-mode driver in accordance with one embodiment of the present invention may correspond to the circuits shown in any one of FIGS. 2, 4(a), and 4(b) driven by the waveforms shown in FIGS. 6(a)-6(c). Table 1 shows the states of transistors M1 and M2 in this current-mode driver for each of twelve regions of operation, I-XII.

TABLE 1

| | Region | | | | | |
|---|---|---|---|---|---|---|
| | I | II | III | IV | V | VI |
| $M_1$ | off | turns on | current increases | drives $I_0/2$ | current continues to increase | drives $I_0$ |
| $M_2$ | drives $I_0$ | drives $I_0$ | current decreases | drives $I_0/2$ | current continues to decrease | turns off |

| | Region | | | | | |
|---|---|---|---|---|---|---|
| | VII | VIII | IX | X | XI | XII |
| $M_1$ | drives $I_0$ | drives $I_0$ | current decreases | drives $I_0/2$ | current continues to decrease | turns off |
| $M_2$ | off | turns on | current increases | drives $I_0/2$ | current continues to increase | drives $I_0$ |

Figure 7:
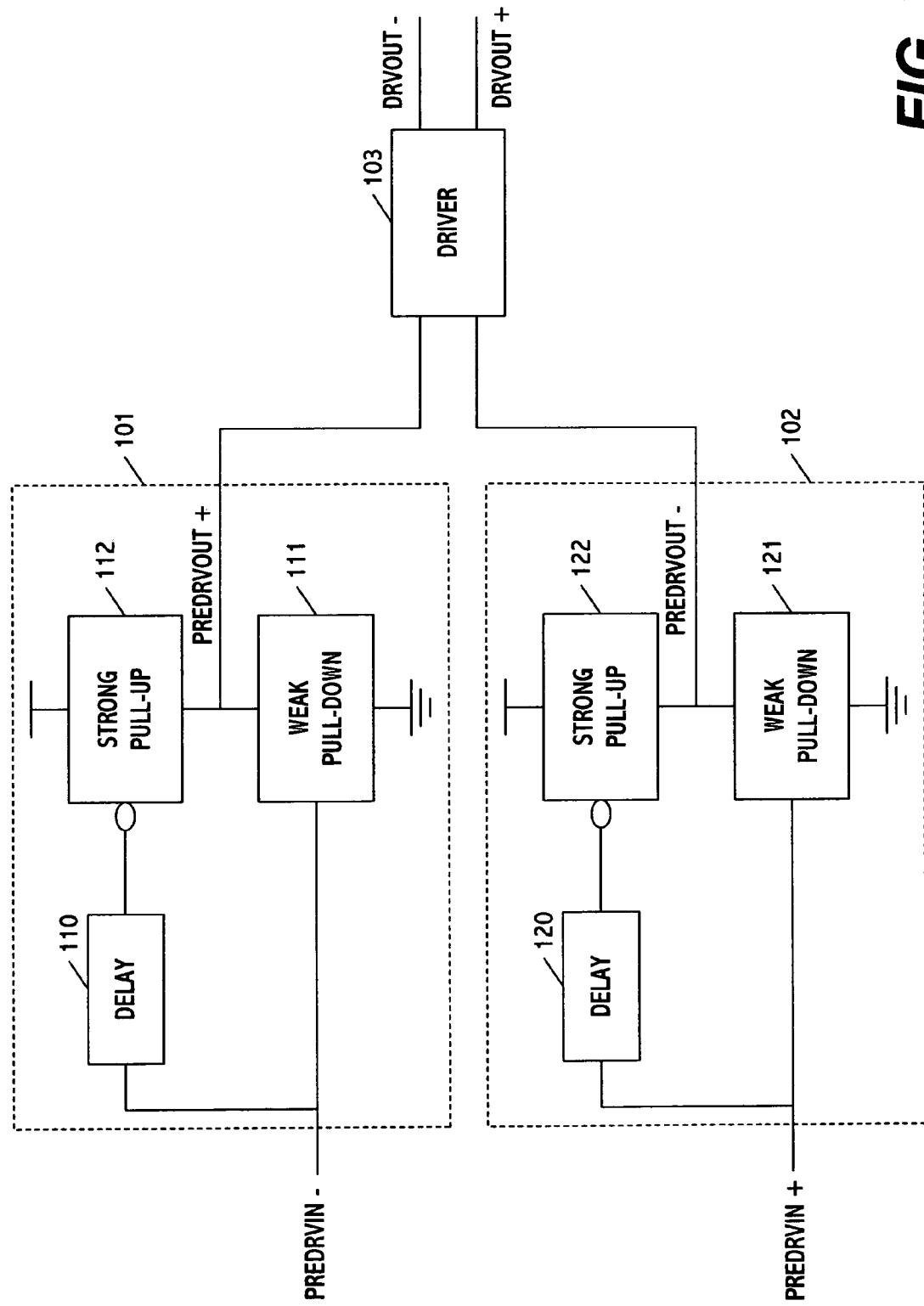
FIG. 7 is a functional block diagram showing a pre-driver circuit capable of generating the waveforms shown in FIGS. 6(a)-6(c) for suppressing rise-and-fall mismatch in a current-mode driver.

FIG. 7 is a functional block diagram of a pre-driver circuit which is capable of generating the waveforms shown in FIGS. 6(a)-6(c) for suppressing rise-and-fall mismatch in a current-mode driver. This circuit includes first and second pre-driver stages 101 and 102 which shape (or pre-distort) the waveforms of pre-driver output signals predrvout+ and predrvout−, respectively, prior to input into a current-mode driver 103. The current-mode driver is driven by the pre-driver output signals and may have a structure as previously described.

The first (or positive polarity) pre-driver stage includes a delay 110, a weak pull-down circuit 111, and strong pull-up circuit 112. The second (or negative polarity) pre-driver stage includes a delay circuit 120, a weak pull-down circuit 121, and a strong pull-up circuit 122. Because the driver is implemented with PMOS transistors, which steer a source current to one side of the circuit or another, the strong pull-up circuit in each pre-driver stage helps to ensure that the rise-transition of the pre-driver output (i.e., switching off time of corresponding transistors (M1, M2) in the driver) starts earlier and yet is shorter (faster) than their fall-transition (switching on) time.

In this and other embodiments, the delay circuits may have the same or different fixed or predetermined delays, however programmable delay circuits may alternatively be used. The quantity of the delay may be determined based on tolerances, e.g., it may be useful in some applications to delay the start of the pull-up operation of the driver transistors by a variable amount The pre-driver stage outputs are determined based on the logical values of the pre-driver inputs, which, because of the differential nature of the driver, may be simultaneously applied with complementary values. Stages 101 and 102 generate pre-driver output signals as shown in FIG. 6(a) when the input signals are applied. Specifically, when pre-driver input signal predrvin+ has a logical 0 value and pre-driver input signal predrvin− has a logical 1 value, predrvout+ is generated by weak pull-down circuit 111 and predrvout− is generated by strong pull-up circuit 122. Conversely, when pre-driver input signal predrvin+ has a logical 1 value and pre-driver input signal predrvin− has a logical 0 value, predrvout+ is generated by strong pull-up circuit 1 12 and predrvout− is generated by weak pull-down circuit 121.

The difference in strengths of the pull-up and pull-down circuits helps to ensure that the rise-transition time of predrvout+ and predrvout− starts later and yet is shorter (steeper) than their fall-transition time, and that I(M1)=I (M2)=$I_0$/2, or substantially so, at the crossing point between the pre-driver output signals. As a result, mismatch is suppressed in the rise and fall transitions of driver output signals drvout+ and drvout−. The strength s of the pull-up circuits compared with the pull-down circuits may be determined by Equation (3). Using this technique, for a given driver design and waveform output, the pre-driver signals may be pre-distorted to achieve or get as close to zero mismatching as possible.

Figure 8:
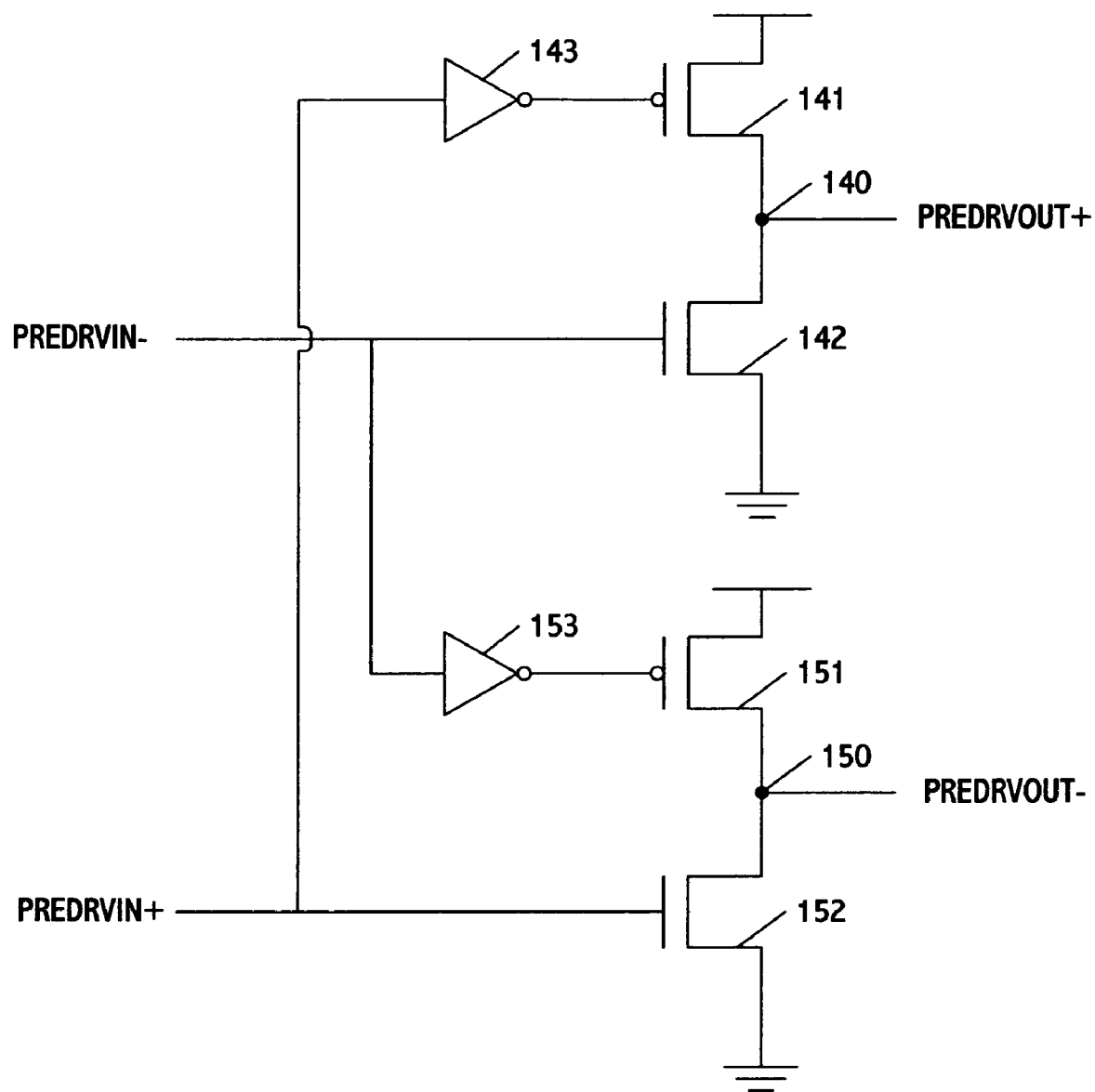
FIG. 8 is a diagram showing a first circuit implementation of the pre-driver of FIG. 7 referred to as an inverter-delayed pull-up (InvDlyPU) pre-driver.

FIG. 8 shows a first circuit implementation of the pre-driver of FIG. 7. In this circuit the delay in each stage is formed from a single inverter, and as such the FIG. 8 circuit may be referred to as an inverter-delayed pull-up (InvDlyPU) pre-driver. To account for the inversion in the delay circuit (which is an inverter), the pre-driver inputs are crossed. That is, the predrvout+ signal is generated from a node 140 between two transistors 141 and 142 having complementary polarities. Transistor 141 is coupled between a supply potential ($V_{CC}$) and node 140 and has the gate coupled to the output of inverter 143. Transistor 142 is coupled between node 140 and a reference potential ($V_{ss}$) and has the gate coupled to input signal predrvin−.

The predrvout− signal is generated from a node 150 between two transistors 151 and 152 having complementary polarities. Transistor 151 is coupled between supply potential $V_{CC}$ and node 150 and has the gate coupled to the output of inverter 153. Transistor 152 is coupled between node 150 and reference potential $V_{ss}$ and has the gate coupled to input signal predrvin+. In this embodiment, transistors 141 and 151 correspond to the strong pull-up circuits and transistors 142 and 152 correspond to the weak pull-down circuits.

To account for the inversion in the delay circuit (which is an inverter), the pre-driver inputs are crossed, i.e., predrvin+ is fed into both pre-driver circuits that generate predrvout+ and predrvout−, and predrvin− is also fed into both pre-driver circuits that generate predrvout+ and predrvout−. This is in contrast to the case in FIG. 7 where the pre-driver inputs are not crossed, i.e. predrvin+ is fed into only the pre-driver circuit that generates predrvout−, and predrvin− is fed into only the pre-driver circuit that generates predrvout+.

In operation, when predrvin+ has a logical 0 value and predrvin− has a logical 1 value, transistors 141 and 152 are turned off and transistors 142 and 151 are turned on. As a result, predrvout+ is drawn towards the reference potential by weak pull-down transistor 142 and predrvout− is drawn towards the supply potential by strong pull-up transistor 151. Conversely, when predrvin+ has a logical 1 value and predrvin− has a logical 0 value, transistors 141 and 152 are turned on and transistors 142 and 151 are turned off. As a result, predrvout+ is drawn towards the supply potential by strong pull-up transistor 141 and predrvout− is drawn towards the reference potential by weak pull-down transistor 152.

The delay in the inverter and the difference in strengths of the pull-up and pull-down circuits may be engineered such that the ratio of the rise transition and the fall transition of predrvout+ and predrvout− follows the relationship given by Equation (3), and that their crossing point is at $V_{cross}$ as derived in Equation (1). As a result, mismatch is suppressed in the rise and fall transitions of driver output signals drvout+ and drvout−.

The inverter-delayed pull-up (InvDlyPU) pre-driver is beneficial in a number of respects. For example, crossing the pre-driver inputs helps to correct duty-cycle errors in the inputs by averaging out, in time, the input transitions. Crossing the pre-driver inputs also helps to reduce the effects of cross-skew of the PMOS and NMOS transistors on the pre-driver outputs (and hence the driver outputs). Another advantage of the InvDlyPU pre-driver in this example is that gate loading to the previous stage (e.g., the stage generating the pre-driver input signals) is reduced because the inverters used as the delays in the InvDlyPU help to buffer some of the gate loadings.

Figure 9:
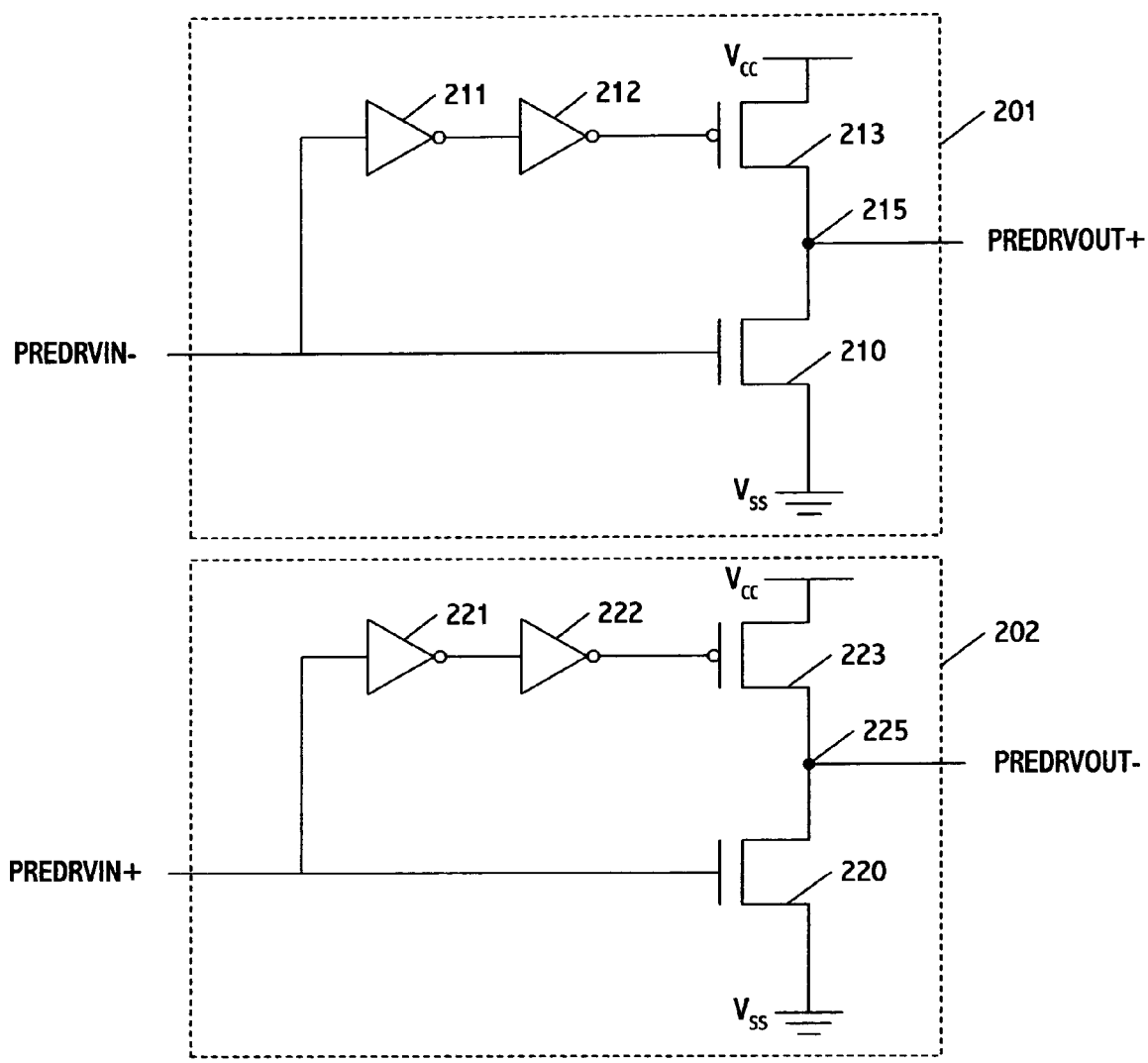
FIG. 9 is a diagram showing a second circuit implementation of the pre-driver of FIG. 7 referred to as a double-inverter-delayed pull-up (DInvDlyPU) pre-driver.

FIG. 9 shows a second circuit implementation of the pre-driver of FIG. 7 referred to as a double-inverter-delayed pull-up (DInvDlyPU) pre-driver. This circuit implementation can be used when the delay provided by one inverter is not sufficient for the delay circuit. Unlike in FIG. 8, the pre-driver inputs are not crossed here and therefore stages 201 and 202 correspond in form to stages 101 and 102 in FIG. 7 respectively. Because the inputs are not crossed, DInvDlyPU outputs are more susceptible to duty cycle errors in the pre-driver inputs as well as effects of cross-skew in the PMOS and NMOS devices. Stage 201 routes pre-driver input signal predrvin− along two signal paths, one coupled to the gate of transistor 210 and the other coupled to the gate of transistor 213 through inverters 211 and 212. Transistor 213 is coupled between output node 215 and a voltage supply ($V_{cc}$) and therefore operates as the strong-pull up circuit. Transistor 210 is coupled between the output node and a reference potential ($V_{ss}$) and therefore operates as the weak pull-down circuit. Pre-driver output signal predrvout+
is generated from node 215.

Stage 202 routes pre-driver input signal predrvin+ along two signal paths, one coupled to the gate of transistor 220 and the other coupled to the gate of transistor 223 through inverters 221 and 222. Transistor 233 is coupled between output node 225 and a voltage supply ($V_{cc}$) and therefore operates as the strong-pull up circuit. Transistor 220 is coupled between the output node and a reference potential ($V_{ss}$) and therefore operates as the weak pull-down circuit. Pre-driver output signal predrvout− is generated from node 225.

In operation, when predrvin+ has a logical 0 value and predrvin− has a logical 1 value, transistors 213 and 220 are turned off and transistors 210 and 223 are turned on. As a result, predrvout+ is drawn towards the reference potential by weak pull-down transistor 210 and predrvout− is drawn towards the supply potential by strong pull-up transistor 223. Conversely, when predrvin+ has a logical 1 value and predrvin− has a logical 0 value, transistors 213 and 220 are turned on and transistors 210 and 223 are turned off. As a result, predrvout+ is drawn towards the supply potential by strong pull-up transistor 213 and predrvou− is drawn towards the reference potential by weak pull-down transistor 220.

Like in previous embodiments, the delay circuit and the difference in strengths of the pull-up and pull-down circuits may be engineered such that the ratio of the rise transition and the fall transition of predrvout+ and predrvout− follows the relationship given by Equation (3), and that their crossing point is at $V_{cross}$ as derived in Equation (1). As a result, mismatch is suppressed in the rise and fall transitions of driver output signals drvout+ and drvout−.

For some applications, the DInvDlyPU pre-driver may not be used if the delay of two cascaded inverters introduce more delay than intended. These same applications may also benefit from the duty-cycle error correction and diminished effects of cross-skew in the NMOS and PMOS devices that cross-coupled pre-driver input implementations such as the InvDlyPU pre-drivers are able to achieve. In these and/or other circumstances, the pre-drivers shown in FIGS. 11 and 12 may be appropriate for use.

Figure 10:
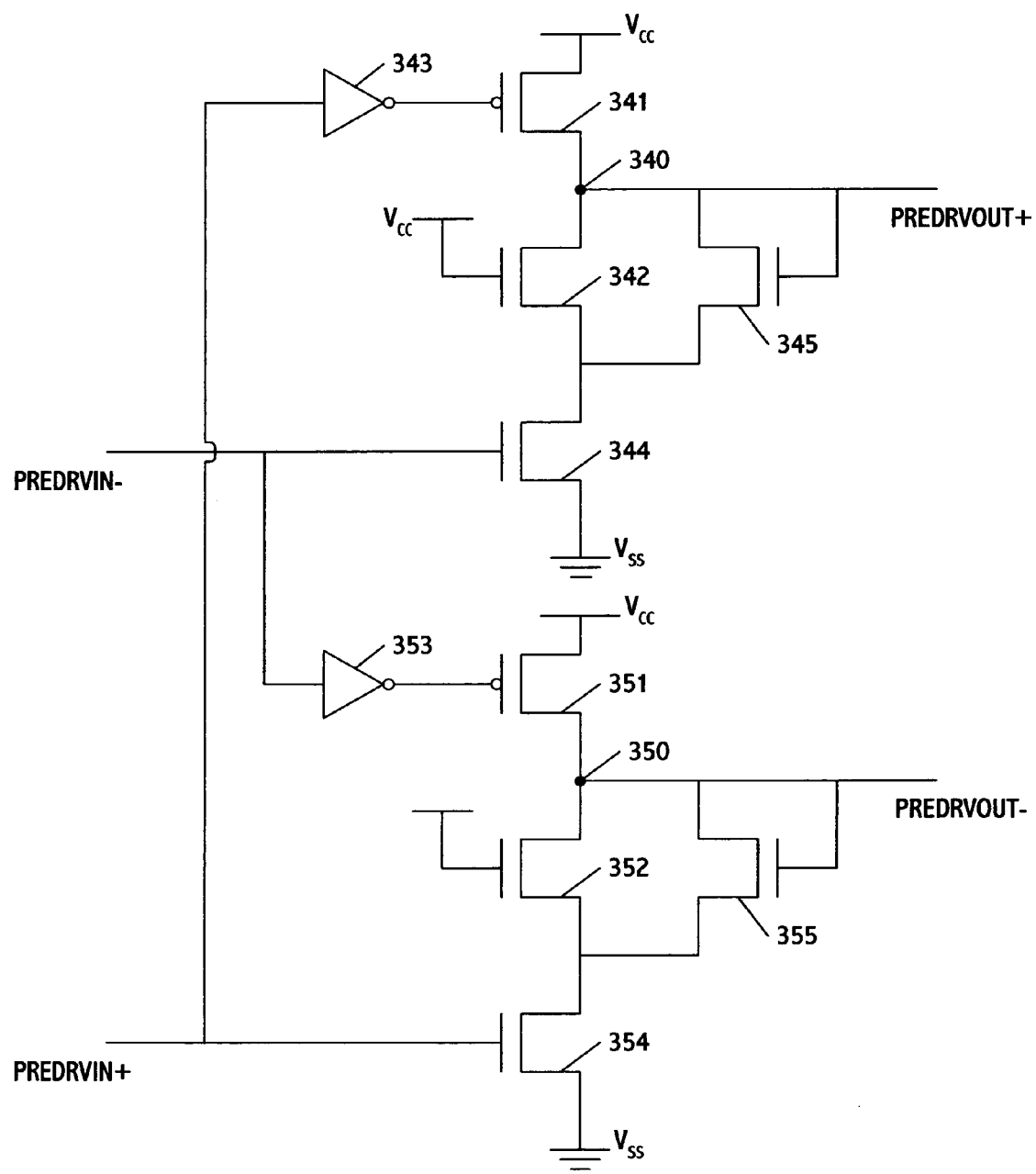
FIG. 10 shows a third circuit implementation of the pre-driver in FIG. 7 referred to as a diode-and-resistor pull-down (DiodeRPD) pre-driver.

FIG. 10 shows a third circuit implementation of the pre-driver of FIG. 7 referred to as a diode-and-resistor pull-down (DiodeRPD) pre-driver. In this design, the pre-driver inputs are crossed and diodes are used to vary the slew rates of the pull-down circuits. The diodes allow the pull-down circuit to be initiated early, and yet the slopes of the pull-downs can be gradually slowed down to provide intended pre-driver output waveforms.

In the DiodeRPD pre-driver, the predrvout+ signal is generated from a node 340 that is coupled to three transistors 341, 342, and diode-coupled 345. Transistor 341 is coupled between a supply potential ($V_{CC}$) and node 340 and has a gate coupled to receive the output of inverter 343. Inverter 343 inverts the predrvin+ input signal. Transistor 342 is coupled in parallel with transistor 345 and between node 340 and another transistor 344, which is coupled to reference potential ($V_{ss}$) on the other end. The gate of transistor 344 is coupled to input signal predrvin−.

Also, as shown, the gates of transistors 342 and 345 are respectively coupled to $V_{cc}$ and node 340, from which the predrvout+ signal is generated. Transistor 345 forms the diode and transistor 342 forms the resistor.

The predrvout− signal is generated from a node 350 that is coupled to three transistors transistors 351, 352, and diode-coupled 355. Transistor 351 is coupled between supply potential $V_{CC}$ and node 350 and has a gate coupled to receive the output of inverter 353. This inverter inverts the predrvin− input signal. Transistor 352 is coupled in parallel with transistor 355 and between node 350 and another transistors 354, which is coupled to reference potential $V_{ss}$ on the other end. The gate of transistor 354 is coupled to receive input signal predrvin+.

Also, as shown, the gates of transistors 352 and 355 are respectively coupled to $V_{cc}$ and node 350, from which the predrvout− signal is generated. Transistor 355 forms the diode and transistor 352 forms the resistor. In this embodiment, transistors 341 and 351 correspond to the strong pull-up circuits. The weak pull-down networks are formed by the combination of transistors 342, 344, and 345, and by the combination of 352, 354, and 355.

In spite of this early pull-down, the slope of the pull-down (i.e., the gradient of the falling waveform corresponding to a 1 to 0 transition out of the pre-driver) is slowed to allow the rising transition of the pre-driver output to be steeper than the falling transition, thereby suppressing mismatch in the driver outputs.

In operation, when predrvin+ has a logical 0 value and predrvin− has a logical 1 value, transistors 352, 354, 355, and 341 are turned off and transistors 342, 344, 345, and 351 are turned on. As a result, predrvout+ is drawn towards the reference potential by the weak pull-down network combination of transistors 342, 344, and 345 and predrvout− is drawn towards the supply potential by strong pull-up transistor 351. Conversely, when predrvin+ has a logical 1 value and predrvin− has a logical 0 value, transistors 352, 354, 355, and 341 are turned on and transistors 342, 344, 345, and 351 are turned off. As a result, predrvout+ is drawn towards the supply potential by strong pull-up transistor 341 and predrvout− is drawn towards the reference potential by the weak pull-down network combination of 352, 354, and 355.

The transistors 344 and 354 allow the pull-down of output nodes 340 and 350 to be initiated early in time. The diode transistors 345 and 355 and the resistor transistors 342 and 352 have decreasing drive strengths when the voltages at the nodes 340 and 350 decrease, slowing down the pull-down operation and hence the falling transition.

Like in previous embodiments, the delay circuit and the difference in strengths of the pull-up and pull-down circuits may be engineered such that the ratio of the rise transition and the fall transition of predrvout+ and predrvout− follows the relationship given by Equation (3), and that their crossing point is at $V_{cross}$ as derived in Equation (1). As a result, mismatch is suppressed in the rise and fall transitions of driver output signals drvout+ and drvout−.

Figure 11:
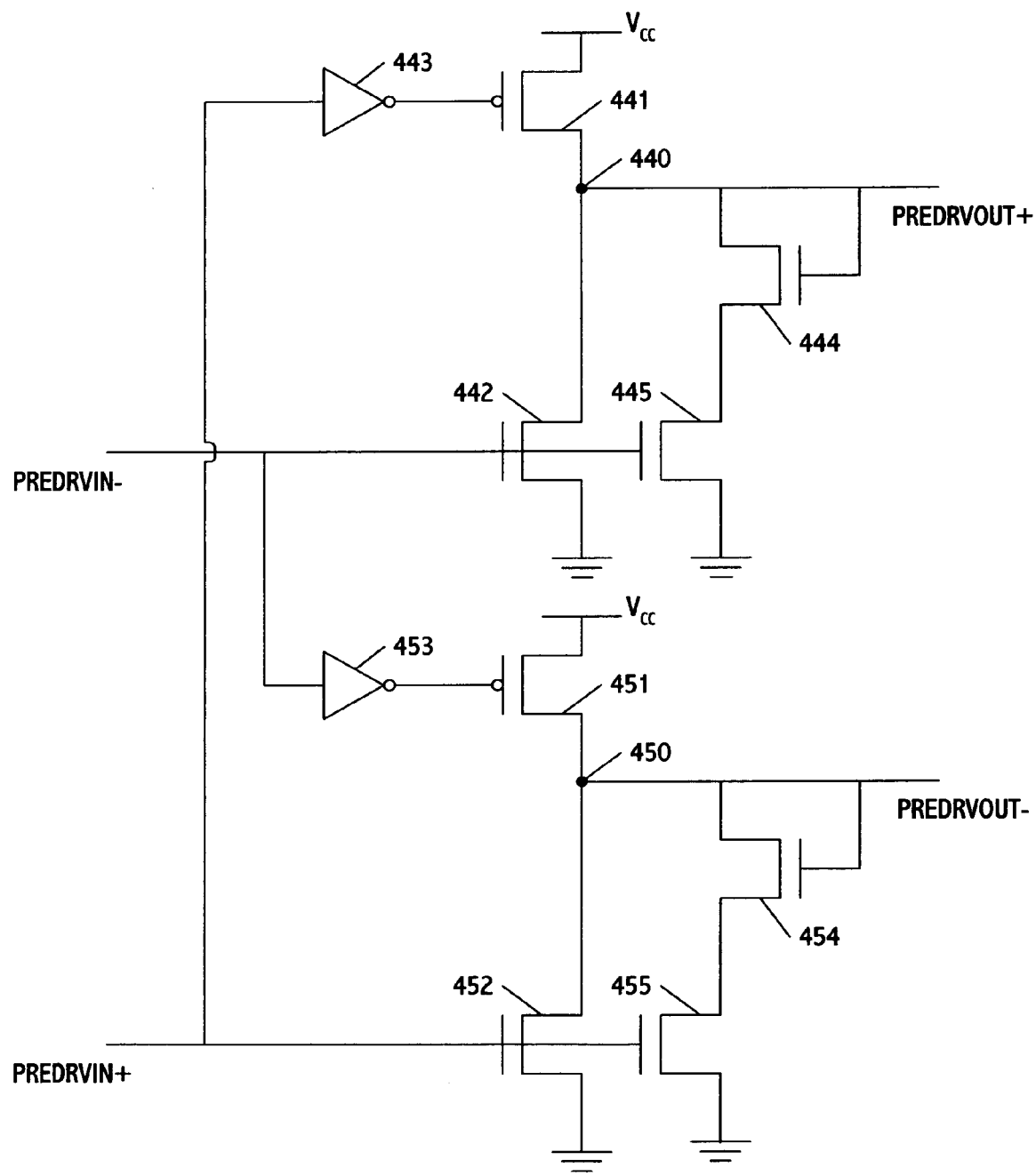
FIG. 11 shows a fourth circuit implementation of the pre-driver in FIG. 7 referred to as a split NMOS pull-down (SplitNPD) pre-driver.

FIG. 11 shows a fourth circuit implementation of a pre-driver referred to as a split NMOS pull-down (splitNPD) pre-driver. The pre-driver inputs are also crossed in this design and diodes are used to vary the slew rates of the pull-down circuits. Like in the FIG. 11 circuit, the diodes allow the pull-down circuits to be initiated early, and yet the slopes of the pull-down transitions can be gradually slowed down to provide intended pre-driver output waveforms. However, the degree of slowing down is controlled by splitting the NMOS pull down device into two, namely 442 and 445. This provides extra flexibility in choosing the slow pull down gradient.

In the SplitNPD pre-driver, the predrvout+ signal is generated from a node 440 that is coupled to three transistors 441, 442, and diode-coupled 444. Transistor 441 is coupled between a supply potential ($V_{CC}$) and node 440 and has a gate coupled to receive the output of inverter 443. Inverter 443 inverts the predrvin+ input signal. Transistor 442 is coupled between node 440 and the $V_{ss}$ reference potential. The drain and gate terminals of transistor 444 are coupled to node 440, while the source of this transistor is coupled to the drain of transistor 445. The gates of transistors 442 and 445 are coupled to receive input signal predrvin−.

The predrvout− signal is generated from a node 450 that is coupled to three transistors transistors 451, 452, and diode-coupled 454. Transistor 451 is coupled between supply potential $V_{CC}$ and node 450 and has a gate coupled to receive the output of inverter 453. This inverter inverts the predrvin− input signal. Transistor 452 is coupled between node 450 and a reference potential. The drain and gate terminals of transistor 454 are coupled to node 450, while the source of this transistor is coupled to the drain of transistor 455. The gates of transistors 452 and 455 are coupled to receive input signal predrvin+.

In operation, when predrvin+ has a logical 0 value and predrvin− has a logical 1 value, transistors 441, 452, 454, and 455 are turned off and transistors 442, 444, 445, and 451 are turned on. As a result, predrvout+ is drawn towards the reference potential by weak pull-down transistor network of 442, 444, and 445, and predrvout− is drawn towards the supply potential by strong pull-up transistor 451. Conversely, when predrvin+ has a logical 1 value and predrvin− has a logical 0 value, transistors 441, 452, 454, and 455 are turned on and transistors 442, 444, 445, and 451 are turned off. As a result, predrvout+ is drawn towards the supply potential by strong pull-up transistor 441 and predrvout− is drawn towards the reference potential by weak pull-down transistor network of 452, 454, and 455.

Like in previous embodiments, the delay circuit and the difference in strengths of the pull-up and pull-down circuits may be engineered such that the ratio of the rise transition and the fall transition of predrvout+ and predrvout− follows the relationship given by Equation (3), and that their crossing point is at $V_{cross}$ as derived in Equation (1). As a result, mismatch is suppressed in the rise and fall transitions of driver output signals drvout+ and drvout−.

The transistors 442 and 445, and transistors 454 and 455 allow the pull-down of output nodes 440 and 450 to be initiated early in time. The diode transistors 444 and 454 have decreasing drive strengths when the voltages at the nodes 440 and 450 decrease, slowing down the pull-down operation and hence the falling transition.

The SplitNPD pre-driver may be least sensitive to input duty-cycle errors. This may be attributed to the crossed inputs into the pre-driver. To a smaller degree, the SplitNPD also proved least sensitive to P:N cross-skew process variations. The net AC common-mode variation for SplitNPD was 40 mV peak-to-peak, which is much lower than the PCI-E Gen2 spec which requires 20 mV RMS. (PCI-E Gen2 spec refers to the PCI-Express Generation 2 specification, which is an industry-wide known specification). One or more embodiments of the pre-driver of the present invention may be used for different applications, and performance may largely depend on the processor and type of transistors used.

Figure 12:
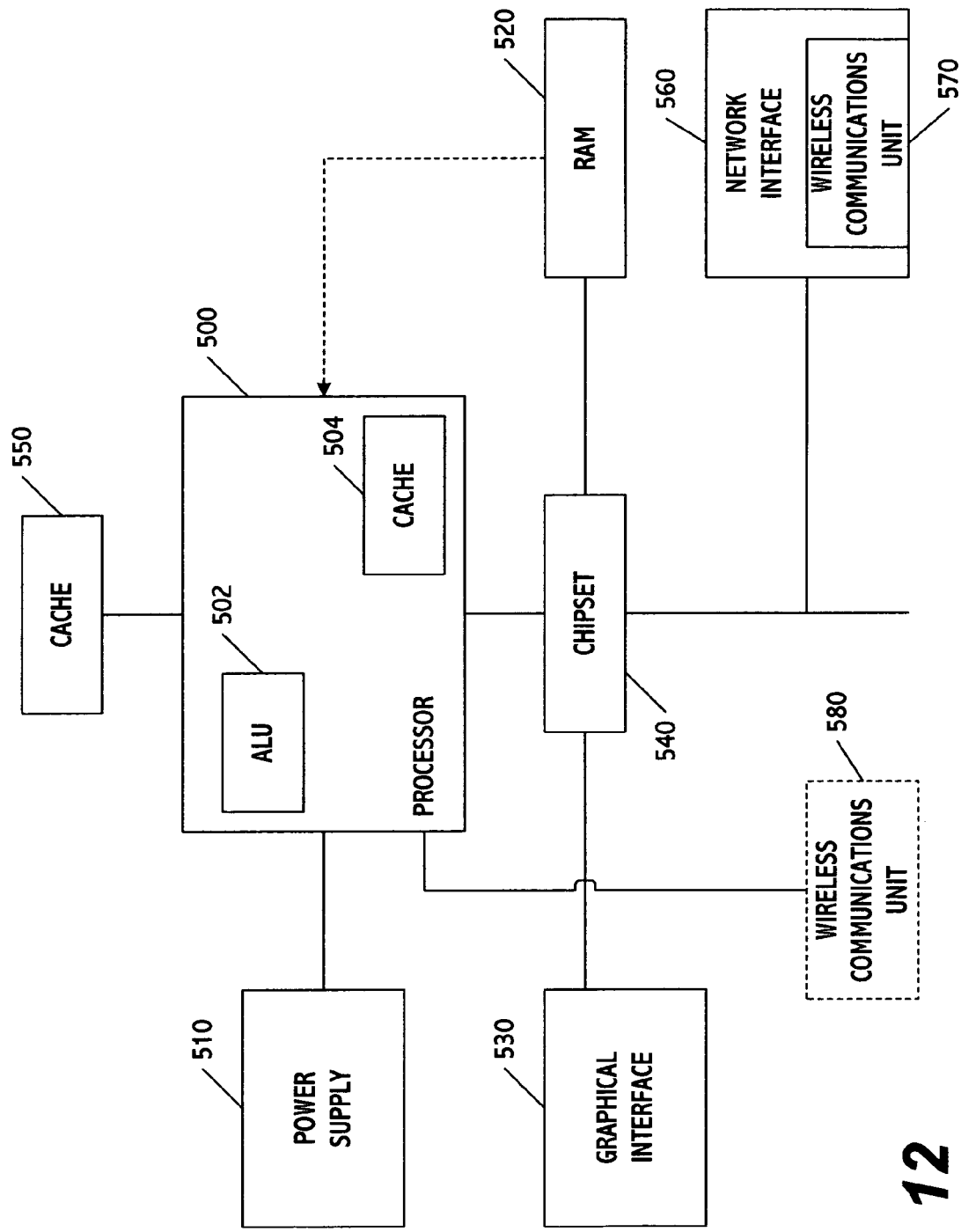
FIG. 12 is a diagram showing an example of a processing system having differential transmission lines which may be controlled by signals generated from any one of the pre-driver embodiments of the present invention.

FIG. 12 shows a system which includes a processor 500, a power supply 510, and a memory 520 which, for example, may be a random-access memory. The processor includes an arithmetic logic unit 502 and an internal cache 504. The system may also include a graphical interface 530, a chipset 540, a cache 550, a network interface 560, and a wireless communications unit 570, which may be incorporated within the network interface. Alternatively, or additionally, a communications unit 580 may be coupled to the processor, and a direct coupling may exist between memory 520 and the processor as well.

A pre-driver in accordance with any of the embodiments of the present invention may be used to charge differential transmission and/or bus lines carrying signals, with attendant mismatch suppression, to, from, or between any of the elements shown in FIG. 14. The pre-drivers may be included in 500 (processor), 520 (RAM), 530 (graphical interface), 540 (chipset), 550 (cache), 560 (network interface), and 580 (communications unit).

The processor may be a microprocessor or any other type of processor, and may be included on a chip die with all or any combination of the remaining features, or one or more of the remaining features may be electrically coupled to the microprocessor die through known couplings and interfaces. Also, the couplings that are shown are merely illustrative, as other couplings between or among the elements depicted may exist depending, for example, on chip platform, functionality, or application requirements.

The foregoing embodiments may yield significant advantages over using inverters as pre-drivers typically used in current-mode drivers in high-speed links, and may be applicable in a wide range of CMOS processes. These advantages may include improved rise and fall matching of driver output waveforms, reduced sensitivity of the transmitter outputs to duty-cycle errors in the pre-driver inputs, and reduced sensitivity of transmitter outputs to P:N cross-skew process variations. As a result, the eye diagram at the receiver may be more widely defined and opened, receiver timing and voltage margins may be improved, and performance bottleneck imposed by error sources may be minimized, all of which combine to allow the link to operate at higher data rates with commensurately lower bit error rate.

Moreover, each of the pre-drivers may be optimized to meet the interface requirements of a given application, which include but are not limited to high-speed I/O interfaces, multiprocessor interconnections (e.g., CSI, peripheral component interconnect (PCI)-Express), data communications and networking switches (e.g., XAUI), memory interfaces (e.g., FBD), and consumer products such as those performing multimedia functions.

One or more of the embodiments may also output full-swing signals, to thereby maximize gate overdrive of the driver devices, which may lead to a number of advantages when compared to non-CMOS swing (i.e. non-full-swing) pre-drivers, such as differential low-swing pre-drivers. Maximizing gate overdrive may result in faster output transitions: (a) increased current capability allows faster switching at the driver outputs, and (b) the driver devices can be reduced which, in turn, reduces parasitic load capacitance introduced by the driver devices at the driver output nodes, all of which reduce driver output transition time.

The foregoing improvements may also lower power consumption, because (a) smaller output capacitive load can be used, which translates into less dynamic power in switching the outputs; (b) gate loading presented to the pre-driver may be reduced, which thereby allows for a reduction in size of the transistors in the pre-driver and hence a reduction in both the power dissipated by the pre-drivers and the power required to switch the gate capacitance of the driver devices; and (c) the constant draw of DC current reminiscent of differential low-swing pre-drivers and the DC current in the biasing circuits are eliminated.

In addition to these improvements, smaller devices may be used to implement the pre-drivers and drivers. The smaller driver devices translate into smaller driver area. The pre-driver sizes can also be scaled down, which allows for a further reduction in device area. Also, the current sources and biasing circuits typically used by differential low-swing pre-drivers can be eliminated, thereby allowing for an additional size reduction.

The foregoing improvements may also allow for higher data rates in the link e.g., rates of 20 Gbps or more are attainable in the simulations conditions in Table 2 and Table 4. This is substantially faster than differential low-swing pre-drivers which, at best, may be able to obtain 16 Gbps under similar simulation conditions.

The foregoing improvements may also allow for well-defined pre-driver output swing and signal levels, e.g., the swing is well-defined in that it resides between $V_{cc}$ and $V_{ss}$. By comparison, differential low-swing pre-driver outputs are referenced to only one supply, either supply potential $V_{cc}$ or reference potential $V_{ss}$ and the other level is process-dependent.

The foregoing improvements also allow for lower supply noise induced jitter. Specifically, since the pre-driver and driver transitions are faster in the pre-driver embodiments, the signals exhibit less supply noise jitter. Moreover, the fact that the output signals are well defined at $V_{cc}$ and $V_{ss}$ means that the pre-driver outputs are not prone to supply noise on either rail ($V_{cc}$ or $V_{ss}$) when the signals are not transitioning.

The foregoing embodiments of the present invention have been described for a line driver using PMOS transistors. The method may be equally applied to an NMOS driver implementation using analogous values.

Also, in the foregoing embodiments only one or two inverters are used along the pre-driver signal paths. In alternative embodiments, different numbers of inverters may be used. When an odd number of inverters is used, it is necessary to cross the pre-driver inputs to account for the odd inversion in the polarity of the delay circuit. Crossing the pre-driver inputs helps to correct duty-cycle errors and cross-skew variations in the PMOS and NMOS devices. When an even number is used, crossing the inputs may not be used. Using a large number of inverters in the signal path will likely increase the area and power of the pre-driver, as well as potential jitter. It therefore may be beneficial for some applications not to set the aggregate delay in the signal path so large that it accounts for a significant portion of the bit time.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to use such feature, structure, or characteristic in connection with other ones of the embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

We claim:
1. A circuit, comprising:
   a first stage to generate a first pre-driver signal; and
   a second stage to generate a second pre-driver signal,
   wherein the first and second stages are to generate the first and second pre-driver signals to have transition times which turn off steering transistors in a driver faster than said steering transistors are turned on by the first and second pre-driver signals, the first and second pre-driver signals to cross at a point which reduces rise-and-fall mismatch in differential signal outputs from a current-mode driver.

2. The circuit of claim 1, wherein said crossing point corresponds to a level which induces at least substantially equal current to flow through steering transistors in the current-mode driver.

3. The circuit of claim 1, wherein said crossing point causes the differential signal outputs from the driver to be at least substantially symmetrical.

4. A circuit, comprising:
a first stage to generate a first pre-driver signal; and
a second stage to generate a second pre-driver signal,
wherein the first and second stages are to generate the first and second pre-driver signals to have steeper slopes when turning off steering transistors in the driver than when turning on said steering transistors, the first and second pre-driver signals to cross at a point which reduces rise-and-fall mismatch in differential signal outputs from a current-mode driver.

5. The circuit of claim 4, wherein said crossing point corresponds to a level which induces at least substantially equal current to flow through steering transistors in the current-mode driver.

6. The circuit of claim 4, wherein said crossing point causes the differential signal outputs from the driver to be at least substantially symmetrical.

7. A circuit, comprising:
a first stage to generate a first pre-driver signal; and
a second stage to generate a second pre-driver signal,
wherein the first and second stages are to generate the first and second pre-driver signals to cross at a point which reduces rise-and-fall mismatch in differential signal outputs from a current-mode driver, and wherein the first stage includes:
a first bias circuit to force the first pre-driver signal towards a first potential; and
a second bias circuit to force the first pre-drive signal towards a second potential,
wherein the first potential prevents steering transistors in the driver from passing source current and the second potential causes said steering transistors to pass source current, said first bias circuit to force the first pre-driver signal towards the first potential at a faster rate than the second bias circuit forces the first pre-driver signal towards the second potential.

8. The circuit of claim 7, wherein the first bias circuit is to be controlled by a first component of a differential input signal and the second bias circuit is controlled by a second component of the differential input signal.

9. The circuit of claim 8, wherein the circuit that shortens said time includes: a diode coupled between an output node of the first pre-driver signal and the second bias circuit; and a resistive element coupled between the output node and the second bias circuit.

10. The circuit of claim 7, wherein the first stage includes:
a delay circuit; and
a node coupled to the first and second bias circuits,
wherein the node is coupled to the first bias circuit through the delay circuit and receives a component of a differential pre-driver input signal.

11. The circuit of claim 10, wherein the first stage includes another delay circuit, wherein the delay circuits are coupled in series between the first bias circuit and the node.

12. The circuit of claim 10, wherein the second stage includes:
a third bias circuit to force the second pre-driver signal towards the first potential; and a fourth bias circuit to force the second pre-driver signal towards the second potential,
said third bias circuit to force the second pre-driver signal towards the first potential at a faster rate than the fourth bias circuit forces the second pre-driver signal towards the second potential.

13. The circuit of claim 12, wherein the first pre-driver signal is to control switching of a first steering transistor in the driver and the second pre-driver signal is to control switching of a second steering transistor in the driver.

14. The circuit of claim 12, wherein the second stage includes:
a delay circuit; and
a node coupled to the third and fourth bias circuits,
wherein the node of the second stage is coupled to the third bias circuit through the delay circuit of the second stage and receives another component of the differential pre-driver input signal.

15. The circuit of claim 14, wherein the second stage includes another delay circuit, and wherein the delay circuits of the second stage are coupled between the third bias circuit and the node of the second stage.

16. The circuit of claim 14, wherein the first and third bias circuits are to operate in a complementary manner, and the second and fourth bias circuits are to operate in a complementary manner.

17. The circuit of claim 7, wherein the second stage includes:
a third bias circuit to force the second pre-driver signal towards the first potential; and a fourth bias circuit to force the second pre-driver signal towards the second potential,
said third bias circuit to force the second pre-driver signal towards the first potential at a faster rate than the fourth bias circuit is to force the second pre-driver signal towards the second potential.

18. The circuit of claim 17, wherein the first and third bias circuits are to be controlled by a first component of a differential input signal and the second and fourth bias circuits are to be controlled by a second component of the differential input signal.

19. The circuit of claim 7, wherein the first stage includes:
a circuit to shorten a time for the first pre-driver signal to reach the second potential, while allowing the first pre-driver signal to reach the first potential at a faster rate than the first pre-driver signal reaches the second potential.

20. The circuit of claim 19, wherein the circuit that shortens said time includes:
a diode; and
a resistive element,
wherein the diode is coupled between an output node of the first pre-driver signal and the resistive element, and the resistive element is coupled between the diode and a source of the second potential.

21. A method for controlling a current-mode driver, comprising:
generating a first pre-driver signal to control a steering transistor in the driver; and
generating a second pre-driver signal to control a complementary steering transistor in the driver, wherein the first and second pre-driver signals are generated to have transition times which turn off said steering transistors faster than said steering transistors are turned on by the first and second pre-driver signals, and wherein the first and second pre-driver signals cross at a point which reduces mismatch in rise and fall transitions of a differential driver signal output.

22. The method of claim 21, wherein said crossing point corresponds to a level which induces at least substantially equal current to flow through said steering transistors.

23. The method of claim 21, wherein said crossing point causes the differential signal output from the driver to be at least substantially symmetrical.

24. A method for controlling a current-mode driver, comprising:
generating a first pre-driver signal to control a steering transistor in the driver; and
generating a second pre-driver signal to control a complementary steering transistor in the driver, wherein the first and second pre-driver signals are generated to have steeper slopes when turning off said steering transistors in the driver than when turning on said steering transistors, and wherein the first and second pre-driver signals cross at a point which reduces mismatch in rise and fall transitions of a differential driver signal output.

25. The method of claim 24, wherein said crossing point corresponds to a level which induces at least substantially equal current to flow through said steering transistors.

26. The method of claim 24, wherein said crossing point causes the differential signal output from the driver to be at least substantially symmetrical.

27. A system, comprising:
a first circuit; and
a second circuit including:
(a) a first stage to generate a first pre-driver signal, and
(b) a second stage to generate a second pre-driver signal, wherein the first and second pre-driver signals have transition times which turn off steering transistors in a driver faster than said steering transistors are turned on by the first and second pre-driver signals, the first and second pre-driver signals to cross at a point which reduces rise-and-fall mismatch in a differential signal output from a current-mode driver.

28. The system of claim 27, wherein the first circuit is selected from the group consisting of a processor, a cache, a memory, a power supply, a graphical interface, a network interface, a wireless communications unit, and a chipset.

29. The system of claim 28, wherein the second circuit is a different one of the group consisting of a processor, a cache, a memory, a power supply, a graphical interface, a network interface, a wireless communications unit, and a chipset.

30. A circuit, comprising:
a first stage to generate a first pre-driver signal; and
a second stage to generate a second pre-driver signal,
wherein the first pre-driver signal is to control a first steering transistor and the second pre-driver signal is to control a second steering transistor, the first and second steering transistors coupled to a source current,
wherein the first and second stages are to generate the first and second pre-driver signals so that current passing through the first and second steering transistors are to at least substantially equal one-half of the source current at a crossing point between the first and second pre-driver signals, and
wherein the first and second stages are to generate the first and second pre-driver signals to cross at a point which reduces rise-and-fall mismatch in differential signal outputs from a current-mode driver which includes the first and second steering transistors.

31. The circuit of claim 30, wherein the first and second stages are to pre-distort the first and second pre-driver signals to cause the currents through the first and second steering transistors to at least substantially equal one-half the source current at said crossing point.

32. The circuit of claim 30, wherein a current-mode driver formed from the first and second steering transistors is to output current signals having at least substantially rise and fall slopes based on the first and second pre-driver signals.

33. A circuit, comprising:
a first stage to generate a first pre-driver signal; and
a second stage to generate a second pre-driver signal,
wherein the first pre-driver signal is to control a first steering transistor and the second pre-driver signal is to control a second steering transistor, the first and second steering transistors coupled to a source current,
wherein the first and second stages are to generate the first and second pre-driver signals so that current passing through the first and second steering transistors are to at least substantially equal one-half of the source current at a crossing point between the first and second pre-driver signals, and
wherein the first and second stages are to generate the first and second pre-driver signals to have transition times which turn off the steering transistors faster than the steering transistors are turned on by the first and second pre-driver signals.

34. A circuit, comprising:
a first stage to generate a first pre-driver signal; and
a second stage to generate a second pre-driver signal,
wherein the first pre-driver signal is to control a first steering transistor and the second pre-driver signal is to control a second steering transistor, the first and second steering transistors coupled to a source current,
wherein the first and second stages are to generate the first and second pre-driver signals so that current passing through the first and second steering transistors are to at least substantially equal one-half of the source current at a crossing point between the first and second pre-driver signals, and
wherein the first and second stages are to generate the first and second pre-driver signals to have steeper slopes when turning off the steering transistors in a driver than when turning on the steering transistors.

35. A circuit, comprising:
a first stage to generate a first pre-driver signal; and
a second stage to generate a second pre-driver signal,
wherein the first pre-driver signal is to control a first steering transistor and the second pre-driver signal is to control a second steering transistor, the first and second steering transistors coupled to a source current,
wherein the first and second stages are to generate the first and second pre-driver signals so that current passing through the first and second steering transistors are to at least substantially equal one-half of the source current at a crossing point between the first and second pre-driver signals, and
wherein the first stage includes:
a first bias circuit to force the first pre-driver signal towards a first potential; and
a second bias circuit to force the first pre-drive signal towards a second potential,
wherein the first potential prevents the steering transistors from passing the source current and the second potential causes the steering transistors to pass the source current, said first bias circuit to force the first pre-driver signal towards the first potential at a faster rate than the second bias circuit forces the first pre-driver signal towards the second potential.

* * * * *